(12) United States Patent
Yamashita (10) Patent No.: US 9,608,193 B2
(45) Date of Patent: Mar. 28, 2017

(54) ACOUSTIC WAVE DEVICE AND METHOD OF FABRICATING THE SAME

(71) Applicant: TAIYO YUDEN CO., LTD., Tokyo (JP)

(72) Inventor: Takashi Yamashita, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 425 days.

(21) Appl. No.: 13/912,997

(22) Filed: Jun. 7, 2013

(65) Prior Publication Data

US 2014/0001917 A1  Jan. 2, 2014

(30) Foreign Application Priority Data

Jun. 28, 2012 (JP) ................................ 2012-145784

(51) Int. Cl.
   *H03H 9/02* (2006.01)
   *H01L 41/08* (2006.01)
   *H01L 41/29* (2013.01)
   *H03H 3/08* (2006.01)
   *H03H 9/145* (2006.01)

(52) U.S. Cl.
   CPC ............. *H01L 41/08* (2013.01); *H01L 41/29* (2013.01); *H03H 3/08* (2013.01); *H03H 9/02559* (2013.01); *H03H 9/14555* (2013.01); *H03H 9/02992* (2013.01); *Y10T 29/42* (2015.01)

(58) Field of Classification Search
   CPC .................. H03H 9/02559; H03H 9/02574
   USPC .......................................... 310/313 A, 313 B
   See application file for complete search history.

(56) References Cited

U.S. PATENT DOCUMENTS

| 3,663,899 A * | 5/1972 | Dieulesaint .......... H03H 9/1452 310/313 C |
| 6,501,154 B2 * | 12/2002 | Morita ................... H01S 5/3202 257/103 |
| 7,400,218 B2 * | 7/2008 | Kidoh ................ H03H 9/14505 333/133 |
| 8,242,861 B2 * | 8/2012 | Yata ................... H03H 9/14594 333/193 |
| 2004/0222717 A1 | 11/2004 | Matsuda et al. |
| 2009/0155945 A1 * | 6/2009 | Sung ...................... H01S 5/0201 438/33 |
| 2012/0119849 A1 * | 5/2012 | Shimizu .................. H03H 3/08 333/193 |

(Continued)

FOREIGN PATENT DOCUMENTS

| JP | 59-072212 A | 4/1984 |
| JP | H3-3514 A | 1/1991 |

(Continued)

OTHER PUBLICATIONS

Japanese Office Action dated Nov. 24, 2015, in a counterpart Japanese patent application No. 2012-145784.

*Primary Examiner* — Shawki S Ismail
*Assistant Examiner* — Bryan Gordon
(74) *Attorney, Agent, or Firm* — Chen Yoshimura LLP (57) ABSTRACT

An acoustic wave device includes: a piezoelectric substrate of which four sides of an upper surface are approximate cleavage directions; and an electrode that is formed on the upper surface of the piezoelectric substrate, and excites an acoustic wave propagating in a direction different from the approximate cleavage directions.

10 Claims, 11 Drawing Sheets

(56) References Cited

U.S. PATENT DOCUMENTS

2012/0139653 A1* 6/2012 Owaki ............... H03H 9/02551
331/163

FOREIGN PATENT DOCUMENTS

| JP | 06-013828 A | 1/1994 |
| JP | 2002-226298 A | 8/2002 |
| JP | 2004-048240 A | 2/2004 |
| JP | 2004-336503 A | 11/2004 |

* cited by examiner

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2012-145784, filed on Jun. 28, 2012, the entire contents of which are incorporated herein by reference.

FIELD

A certain aspect of the present invention relates to an acoustic wave device and a method of fabricating the same.

BACKGROUND

There has been known acoustic wave devices using a piezoelectric substrate such as a lithium tantalate ($LiTaO_3$) substrate. In such acoustic wave devices, a comb-shaped electrode is formed on the piezoelectric substrate. The comb-shaped electrode excites an acoustic wave on the surface of the piezoelectric substrate.

Japanese Patent Application Publication No. 3-3514 (Patent Document 1) discloses that the longitudinal direction of an acoustic wave device chip is made to be almost the cleaved surface of a lithium tantalate single crystal by using a lithium tantalate substrate with an X-plane.

The technique disclosed in Patent Document 1 can easily separate the substrate into individual chips because the longitudinal direction of the acoustic wave device chip is the cleaved surface. However, the plane direction of the disclosed technique is not suitable for mobile communication, and thus insertion loss of the acoustic wave device increases. On the other hand, problems may occur in separating the substrate into individual chips when a scribe line direction is determined in favor of characteristics of the acoustic wave device. For example, when the substrate is separated into individual chips by scribe and break, a cut surface meanders or inclines if the cleavage direction do not coincide with the scribe line direction. When the substrate is separated by dicing, production cost increases because supplies such as water and blades are used.

SUMMARY OF THE INVENTION

According to an aspect of the present invention, there is provided an acoustic wave device including: a piezoelectric substrate of which four sides of an upper surface are approximate cleavage directions; and an electrode that is formed on the upper surface of the piezoelectric substrate and excites an acoustic wave propagating in a direction different from the approximate cleavage directions.

According to another aspect of the present invention, there is provided a method of fabricating an acoustic wave device, the method comprising: forming an electrode exciting an acoustic wave on an upper surface of a piezoelectric substrate; forming grooves or modified regions that extend in two approximate cleavage directions that differ from a propagation direction of the acoustic wave and intersect with each other in the piezoelectric substrate; and breaking the piezoelectric substrate along the grooves or the modified regions.

DETAILED DESCRIPTION

Figure 1:
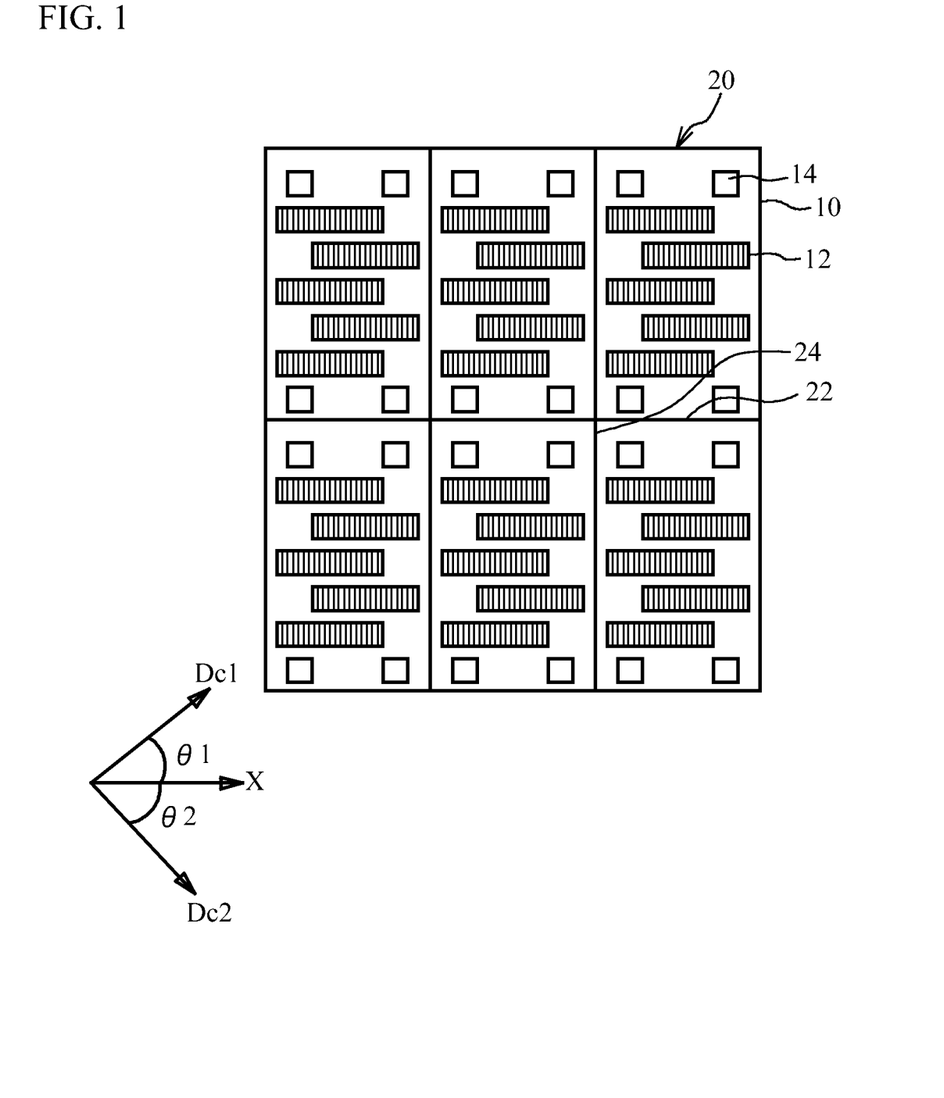
FIG. 1 is a plan view of an acoustic wave device in accordance with a comparative example.

A description will first be given of a comparative example that separates an acoustic wave device into individual chips by breaking. FIG. 1 is a plan view of an acoustic wave device before separation in accordance with the comparative example. As illustrated in FIG. 1, electrodes 12 are formed on a piezoelectric substrate 10 that is a lithium tantalate substrate. Pads 14 coupled to the electrodes 12 are formed on the piezoelectric substrate 10. The electrodes 12 are comb-shaped electrodes exciting a surface acoustic wave. Scribe lines 22 and 24 used to cut the piezoelectric substrate 10 are formed on the piezoelectric substrate 10. The scribe lines 22 become the shorter sides of acoustic wave device chips 20, and the scribe lines 24 become the longer sides. Two or more comb-shaped electrodes 12 and the electrode pads 14 coupled to the comb-shaped electrodes 12 are formed in each region of individual acoustic wave device chips 20.

In the surface acoustic wave device with the above described configuration, the propagation direction of the acoustic wave is made to be the X direction of a lithium tantalate single crystal to obtain good characteristics. In this case, angles between cleavage directions Dc1 and Dc2 of the lithium tantalate single crystal and the X direction are θ1 and θ2 respectively. The extending directions of the scribe lines 22 and 24 that divide regions of individual acoustic wave device chips 20 in the piezoelectric substrate 10 differ from the cleavage directions Dc1 and Dc2.

As described above, to separate the acoustic wave device into individual chips in the piezoelectric substrate 10 including the acoustic wave device chips 20 formed thereon, grooves are formed on the surface of the piezoelectric substrate 10 by irradiating dicing regions along the scribe lines 22 and 24 in the piezoelectric substrate 10 with a laser beam to reduce the thickness of the piezoelectric substrate 10. Or, modified regions are formed inside the piezoelectric substrate 10 by irradiating the piezoelectric substrate 10 along the scribe lines 22 and 24 with a laser beam. Then, the piezoelectric substrate 10 is broken along the scribe lines 22 and 24 with a break blade and/or expander, and thereby individual acoustic wave device chips 20 are separated.

Figure 2A:
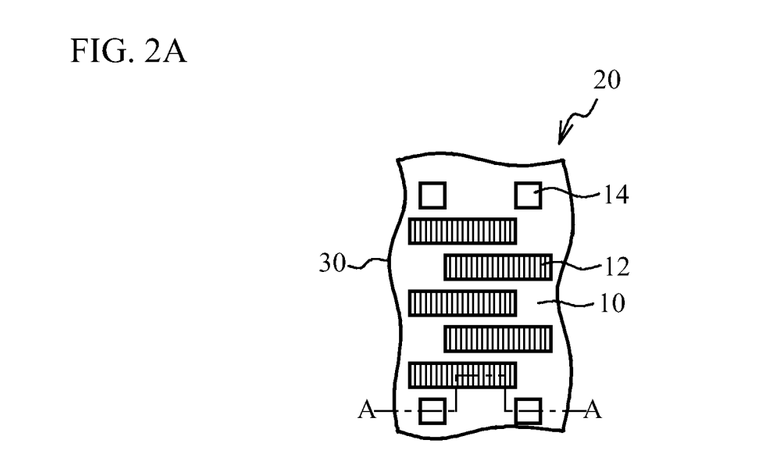
FIG. 2A and FIG. 2B are diagrams illustrating an acoustic wave device chip in the comparative example.
Figure 2B:
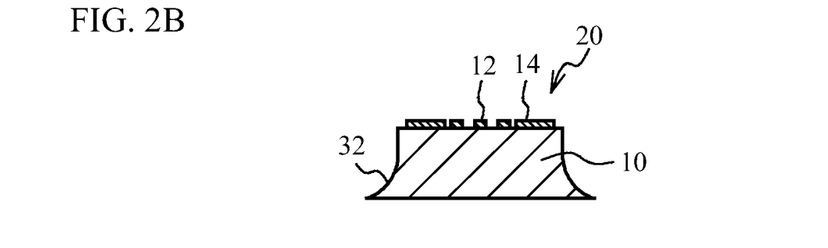

FIG. 2A and FIG. 2B are diagrams illustrating the acoustic wave device chip in the comparative example. FIG. 2A is a plan view, and FIG. 2B is a cross-sectional view taken along line A-A in FIG. 2A. The cut surface meanders as with a cut surface 30 illustrated in FIG. 2A. The piezoelectric substrate 10 is cut in an oblique direction as with a cut surface 32 illustrated in FIG. 2B. As described above, in the comparative example, the cutting direction greatly differs from the cleavage direction of the piezoelectric substrate 10. Thus, the cleavage direction of the piezoelectric substrate 10 greatly differs from the extending directions of the scribe lines 22 and 24 when separating the substrate into individual chips, and thereby cut surfaces along the scribe lines 22 and 24 illustrated in FIG. 2B meander and/or incline. However, when the cutting direction for separation is made to be the cleavage direction, the propagation direction of the acoustic wave differs from a favorable direction, and characteristics of the acoustic wave device degrade. Embodiments described hereinafter allow favorable characteristics of the acoustic wave device and makes the separation into individual chips easy.

First Embodiment

Figure 3A:
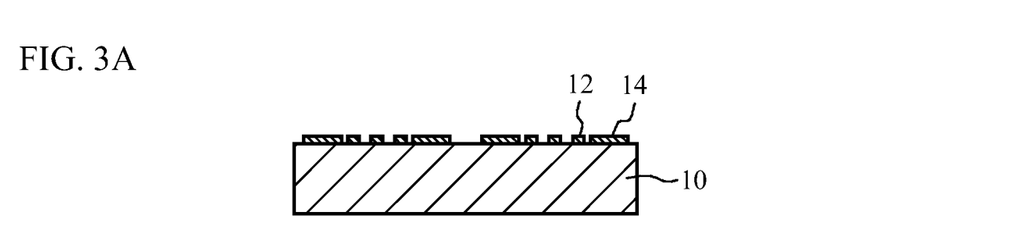
FIG. 3A through FIG. 3C are cross-sectional views illustrating a method of fabricating an acoustic wave device in accordance with a first embodiment.
Figure 3B:
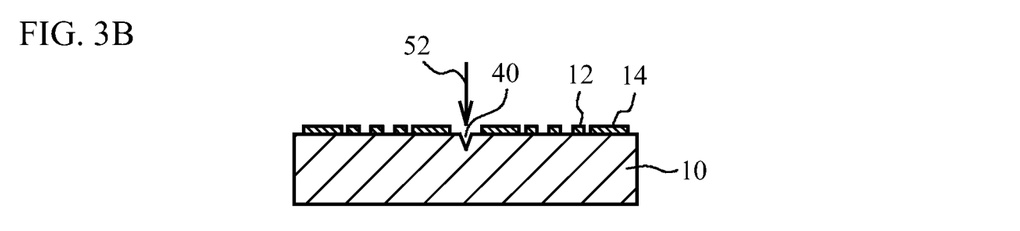
Figure 3C:
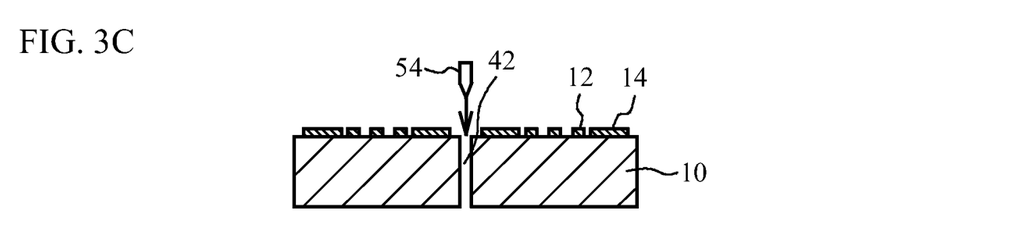
Figure 4:
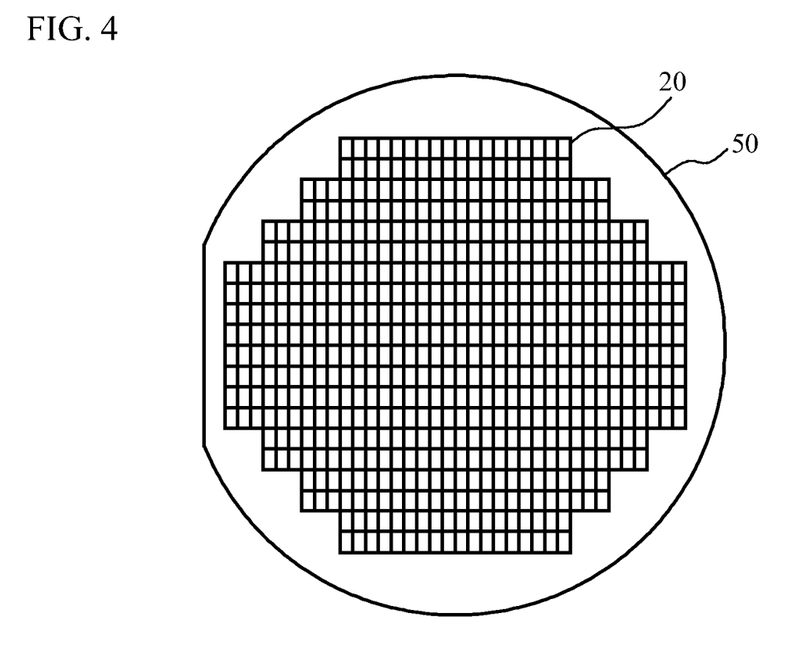
FIG. 4 is a plan view illustrating the method of fabricating the acoustic wave device in accordance with the first embodiment (No. 1)
Figure 5:
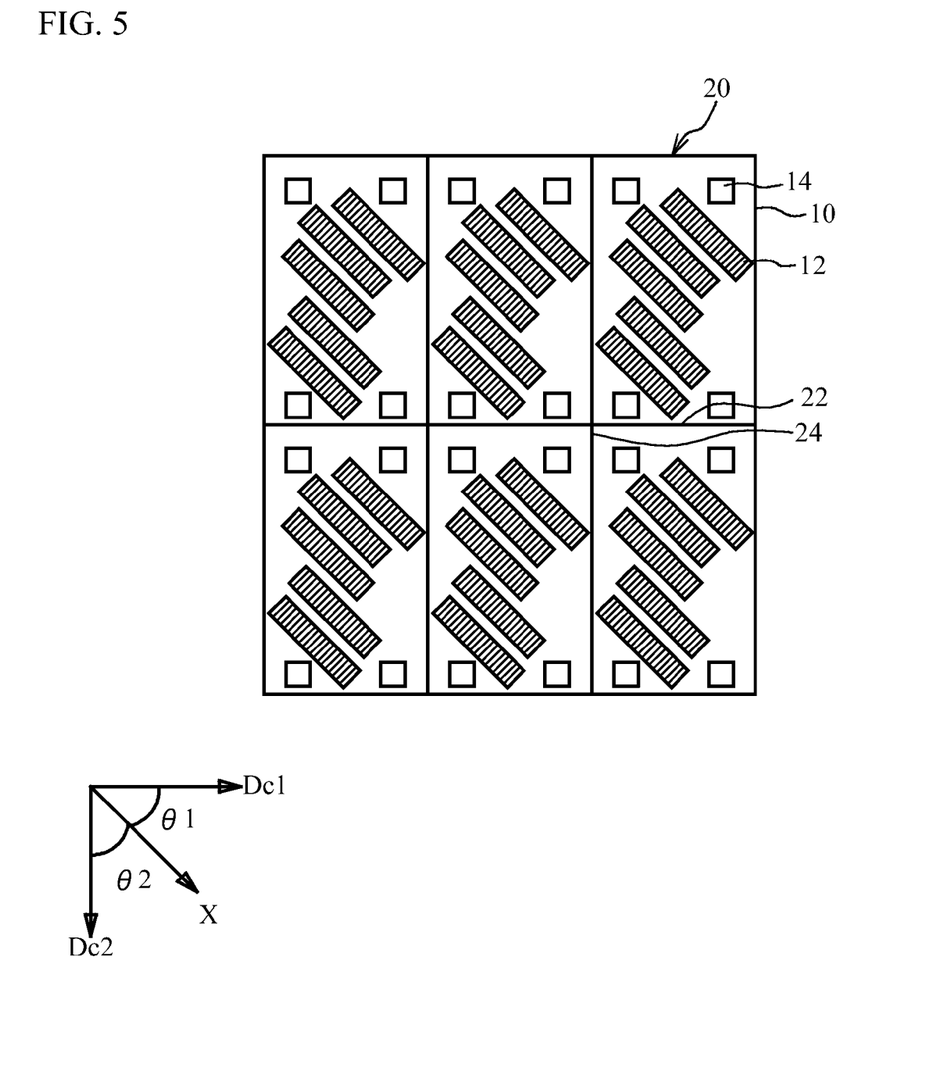
FIG. 5 is a plan view illustrating the method of fabricating the acoustic wave device in accordance with the first embodiment (No. 2)
Figure 6:
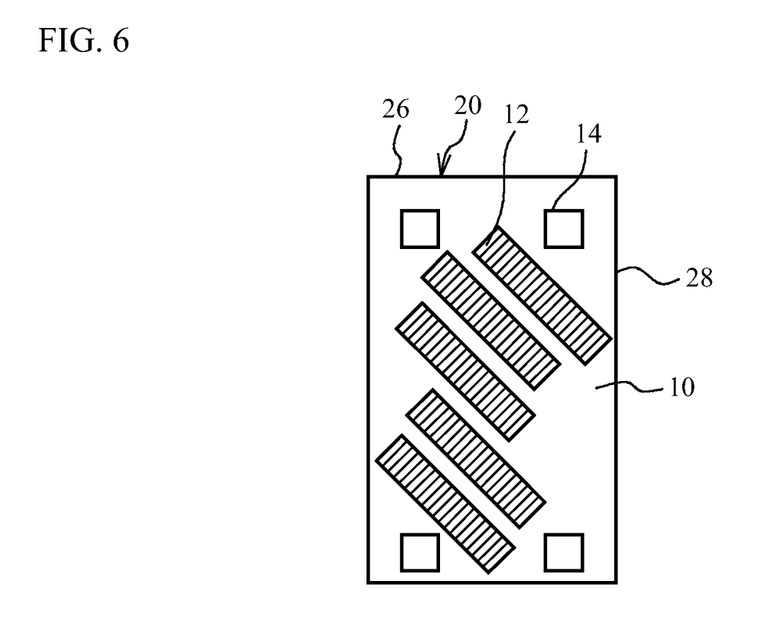
FIG. 6 is a plan view of the acoustic wave device chip in accordance with the first embodiment.

FIG. 3A through FIG. 3C are cross-sectional views illustrating a method of fabricating an acoustic wave device in accordance with a first embodiment. FIG. 4 and FIG. 5 are plan views illustrating the method of fabricating the acoustic wave device in accordance with the first embodiment. FIG. 6 is a plan view of the acoustic wave device in accordance with the first embodiment. As illustrated in FIG. 3A, the electrodes 12 and the pads 14 are formed on the piezoelectric substrate 10 using a metal film. The piezoelectric substrate 10 is a lithium tantalate substrate, and has a film thickness of, for example, 200 to 300 μm. The metal film mainly includes aluminum (Al), and has a film thickness of, for example, 200 to 400 nm. As illustrated in FIG. 4, the piezoelectric substrate 10 is in a state of a wafer 50. Regions to be the acoustic wave device chips 20 are formed in the wafer 50 in a matrix shape. The regions to be the acoustic wave device chips 20 have a size of a few hundred micrometers to a few millimeters.

As illustrated in FIG. 5, the electrodes 12 and the pads 14 are formed in each of the regions to be the acoustic wave device chips 20. The electrode 12 is a comb-shaped electrode exciting an acoustic wave (e.g. surface acoustic wave) or an IDT (Interdigital Transducer) including two comb-shaped electrodes. The electrodes 12 and the pads 14 are electrically coupled to each other by wiring or the like, which is not illustrated. The propagation direction of the acoustic wave excited by the electrode 12 is the X direction for example. On the other hand, the extending directions of the scribe lines 22 and 24 are approximate cleavage directions Dc1 and Dc2. The propagation direction of the acoustic wave is, for example, a direction perpendicular to electrode fingers of the comb-shaped electrode.

The extending directions of the scribe lines 22 and the scribe lines 24 almost coincide with the cleavage directions Dc1 and the cleavage direction Dc2 of a lithium tantalate single crystal at angles of θ1 and θ2 to the X direction of the single crystal substrate, respectively. Thus, the comb-shaped electrodes or IDTs 12 in the region to be the acoustic wave device chip 20 are located on the upper surface of the piezoelectric substrate 10, which is a lithium tantalate single crystal substrate, so as not to be parallel to the scribe line 22 or the scribe line 24.

As illustrated in FIG. 3B, the upper surface of the piezoelectric substrate 10 is irradiated with a laser beam 52. The laser beam 52 may be a second harmonic with a wavelength of 532 nm, for example. This process forms grooves 40 along the scribe lines 22 and 24 on the upper surface of the piezoelectric substrate 10. As illustrated in FIG. 3C, a break blade 54 is pressed against the piezoelectric substrate 10 to form a crack 42. As described above, the piezoelectric substrate 10 is separated into individual chips by breaking. A roller or the like may be used for the breaking instead of the break blade. The above described process forms the acoustic wave device chip 20 illustrated in FIG. 6. Four sides 26 and 28 of the acoustic wave device chip 20 become approximate cleavage directions. The approximate cleavage direction represents a cleavage direction to the extent that cut surfaces do not meander or incline unlike the cut surfaces illustrated in FIG. 2A or FIG. 2B.

A 42° Y-cut X-propagation lithium tantalate substrate is used as the piezoelectric substrate 10, for example. When the Y-cut angle is, for example, 42°, both angles θ1 and θ2 formed by the X direction and the cleavage directions Dc1 and Dc2 are 46.7°, and when the Y-cut angle is, for example, 46°, both angles θ1 and θ2 formed by the X direction and the cleavage directions Dc1 and Dc2 are 46.75°. Thus, the electrodes 12 are formed so that angles between the propagation direction of the acoustic wave and the shorter side 26 and longer side 28 of the acoustic wave device chip 20 are approximately 45°. This allows the scribe lines 22 and 24, which are to be the shorter side 26 and the longer side 28 respectively, to extend in almost the cleavage directions. Therefore, the meandering and inclination of the cut surfaces illustrated in FIG. 2A and FIG. 2B can be suppressed. Thus, as illustrated in FIG. 5, the extending directions of the scribe line 22 and the scribe line 24 used to form the shorter side 26 and the longer side 28 of the acoustic wave device chip 20 can be made to coincide with the cleavage directions of the piezoelectric substrate 10, which is a lithium tantalate single crystal substrate, by forming the comb-shaped electrodes or IDTs 12 so that angles between the propagation direction of the acoustic wave and the shorter side 26 and longer side 28 of the acoustic wave device chip 20 are approximately 45°. The comb-shaped electrodes or IDTs are located parallel to each other.

As described above, the first embodiment forms the grooves 40 extending in two approximate cleavage directions Dc1 and Dc2, which differ from the propagation direction X of the acoustic wave and intersect with each other, in the piezoelectric substrate 10 as illustrated in FIG. 3B and FIG. 5. As illustrated in FIG. 3C, the piezoelectric substrate 10 is broken along the grooves 40. This causes the four sides of the acoustic wave device chip 20 to be in approximate cleavage directions. Thus, the piezoelectric substrate 10 can be cut in almost the cleavage directions, and therefore meandering and inclination of cut surfaces can be suppressed. In addition, compared to dicing, use of supplies such as water and blades can be reduced, and thus cost can be reduced. As described above, separating a substrate into individual chips becomes easy. The propagation direction of the acoustic wave is made to be a direction in which characteristics of the acoustic wave device are good. For example, the propagation direction of the acoustic wave is made to be a direction different from the extending directions of the scribe lines 22 and 24 for example. This allows the characteristics of the acoustic wave device to be good.

A lithium tantalate substrate is used as the piezoelectric substrate 10, but a lithium niobate substrate or the like may be used instead. When a lithium tantalate substrate is used, the propagation direction of the acoustic wave is preferably the X direction. This enables to improve characteristics of the acoustic wave device. Further, the piezoelectric substrate 10 is preferably a greater than or equal to 39° and less than or equal to 48° Y-cut X-propagation lithium tantalate substrate. This makes the angle between the cleavage directions Dc1 and Dc2 approximately 90°. Therefore, even when the scribe lines 22 and 24 perpendicularly intersect with each other, the scribe lines 22 and 24 can be made to extend in almost the cleavage directions. In addition, characteristics of the acoustic wave device can be made good by configuring the Y-cut angle to be from 39° to 48°. The Y-cut angle is more preferably from 40° to 46°.

Figure 7A:
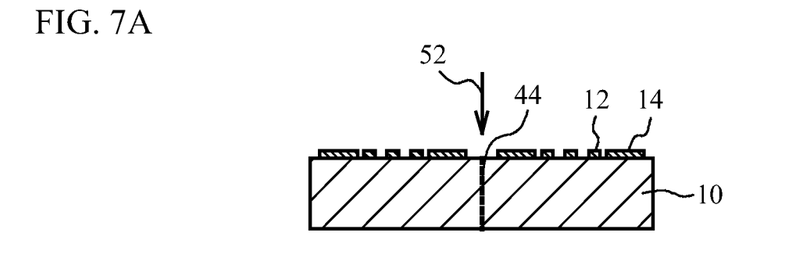
FIG. 7A and FIG. 7B are cross-sectional views illustrating a method of fabricating an acoustic wave device in accordance with a first variation of the first embodiment.
Figure 7B:
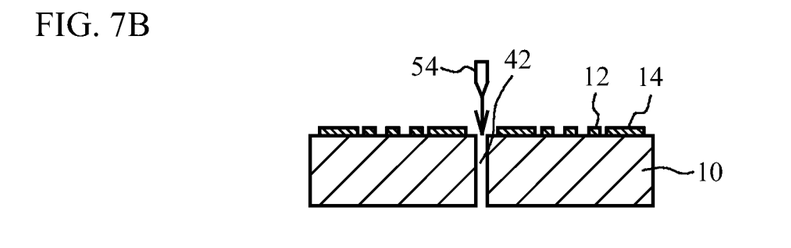

FIG. 7A and FIG. 7B are cross-sectional views illustrating a method of fabricating an acoustic wave device in accordance with a first variation of the first embodiment. As with the first embodiment, the electrodes 12 and the pads 14 are formed on the piezoelectric substrate 10. As illustrated in FIG. 7A, a modified region 44 is formed in the piezoelectric substrate 10 with the laser beam 52. The modified region 44 is a region formed by melting of the piezoelectric substrate 10 on which the laser beam 52 is focused. As illustrated in FIG. 7B, the piezoelectric substrate 10 is broken as described in the first embodiment. This process separates the piezoelectric substrate 10 into individual chips.

As described in the first variation of the embodiment, the modified region 44 may be formed in the piezoelectric substrate 10 instead of the groove 40. The groove 40 or the modified region 44 can be formed by irradiating the piezoelectric substrate 10 with the laser beam 52. Use of the laser beam 52 allows the groove 40 or the modified region 44 to be easily formed without using supplies.

Figure 8A:
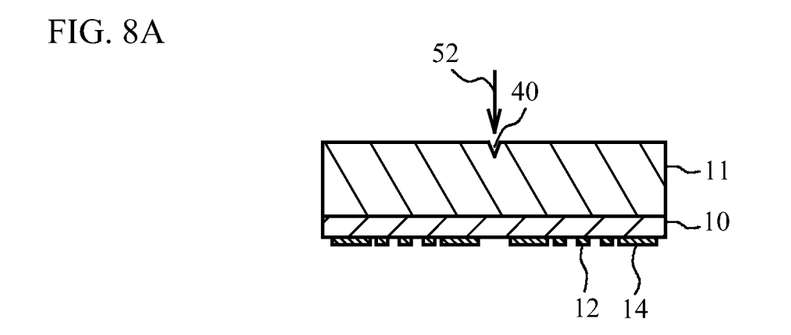
FIG. 8A and FIG. 8B are cross-sectional views illustrating a method of fabricating an acoustic wave device in accordance with a second variation of the first embodiment.
Figure 8B:
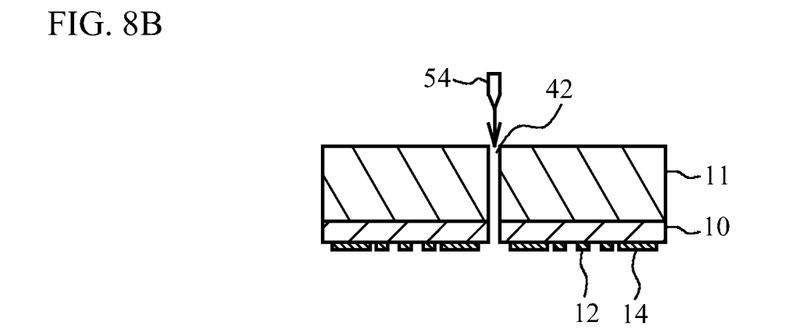

FIG. 8A and FIG. 8B are cross-sectional views illustrating a method of fabricating an acoustic wave device in accordance with a second variation of the first embodiment. The lower surface of the piezoelectric substrate 10 is bonded to a support substrate 11. The support substrate 11 is a sapphire substrate for example. As with the first embodiment, the electrodes 12 and the pads 14 are formed on the piezoelectric substrate 10. As illustrated in FIG. 8A, the groove 40 is formed on the lower surface of the support substrate 11 with the laser beam 52. As illustrated in FIG. 8B, as with the first embodiment, the piezoelectric substrate 10 and the support substrate 11 are broken by forming the crack 42 in the piezoelectric substrate 10 and the support substrate 11. This process separates the piezoelectric substrate 10 and the support substrate 11 into individual chips.

Figure 9A:
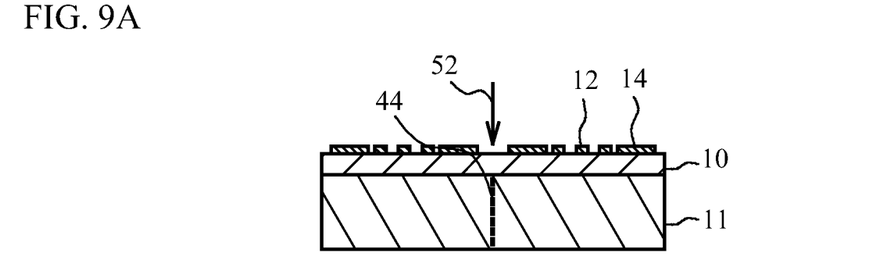
FIG. 9A and FIG. 9B are cross-sectional views illustrating a method of fabricating an acoustic wave device in accordance with a third variation of the first embodiment.
Figure 9B:
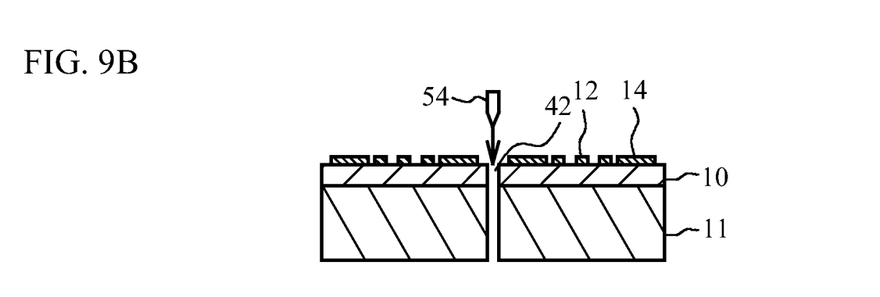

FIG. 9A and FIG. 9B are cross-sectional views illustrating a method of fabricating an acoustic wave device in accordance with a third variation of the first embodiment. As illustrated in FIG. 9A, the modified region 44 is formed in the piezoelectric substrate 10 with the laser beam 52. The modified region 44 is a region of the support substrate 11 formed by focusing the laser beam 52 to heat the region locally and melting selectively. As illustrated in FIG. 9B, as with the second variation, the piezoelectric substrate 10 and the support substrate 11 are broken. This process separates the piezoelectric substrate 10 and the support substrate 11 into individual chips.

Even in the second and third variations, which include the support substrate 11 to which the piezoelectric substrate 10 is bonded, the acoustic wave device chip 20 can be formed in the same manner as the first embodiment and the first variation thereof. Even when the piezoelectric substrate 10 is bonded to the support substrate 11, the meandering and inclination of the cut surfaces of the piezoelectric substrate 10 illustrated in FIG. 2A and FIG. 2B also occur. Therefore, even when the support substrate 11 is included, meandering and inclination of the cut surface are suppressed, and separating the substrates into individual chips becomes easy. As described above, even in the piezoelectric substrate 10 including the support substrate 11, meandering and/or inclination of the separated and cut surfaces along its scribe line 24 can be greatly suppressed, the separation into individual chips becomes easy, and the fabrication yield of the acoustic wave device can be increased.

Figure 10A:
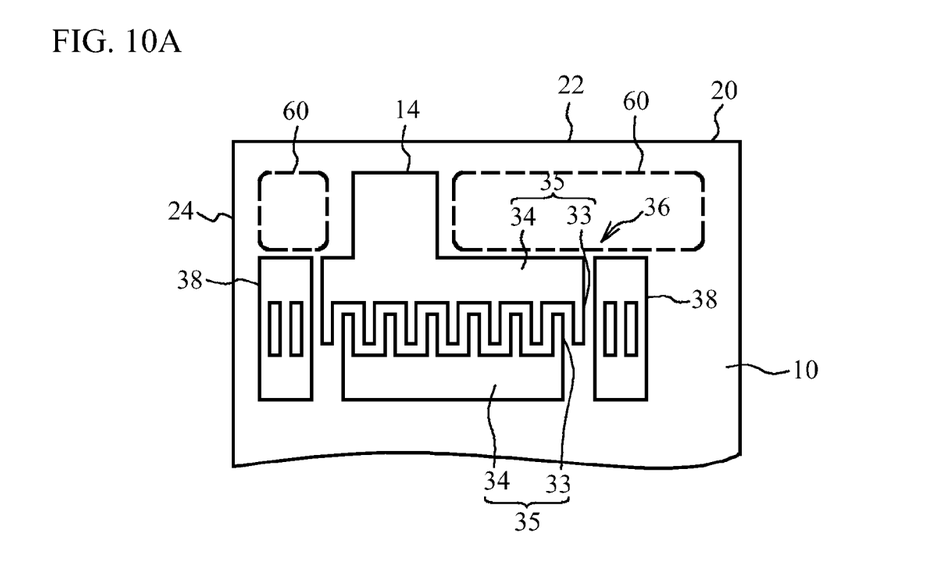
FIG. 10A and FIG. 10B are plan views of a part of the acoustic wave device chip in accordance with the comparative example.
Figure 10B:
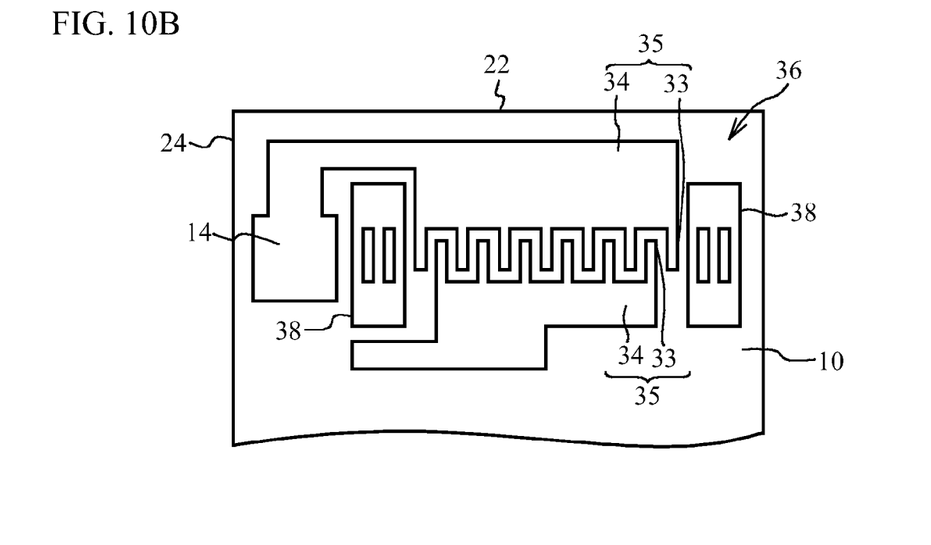
Figure 11:
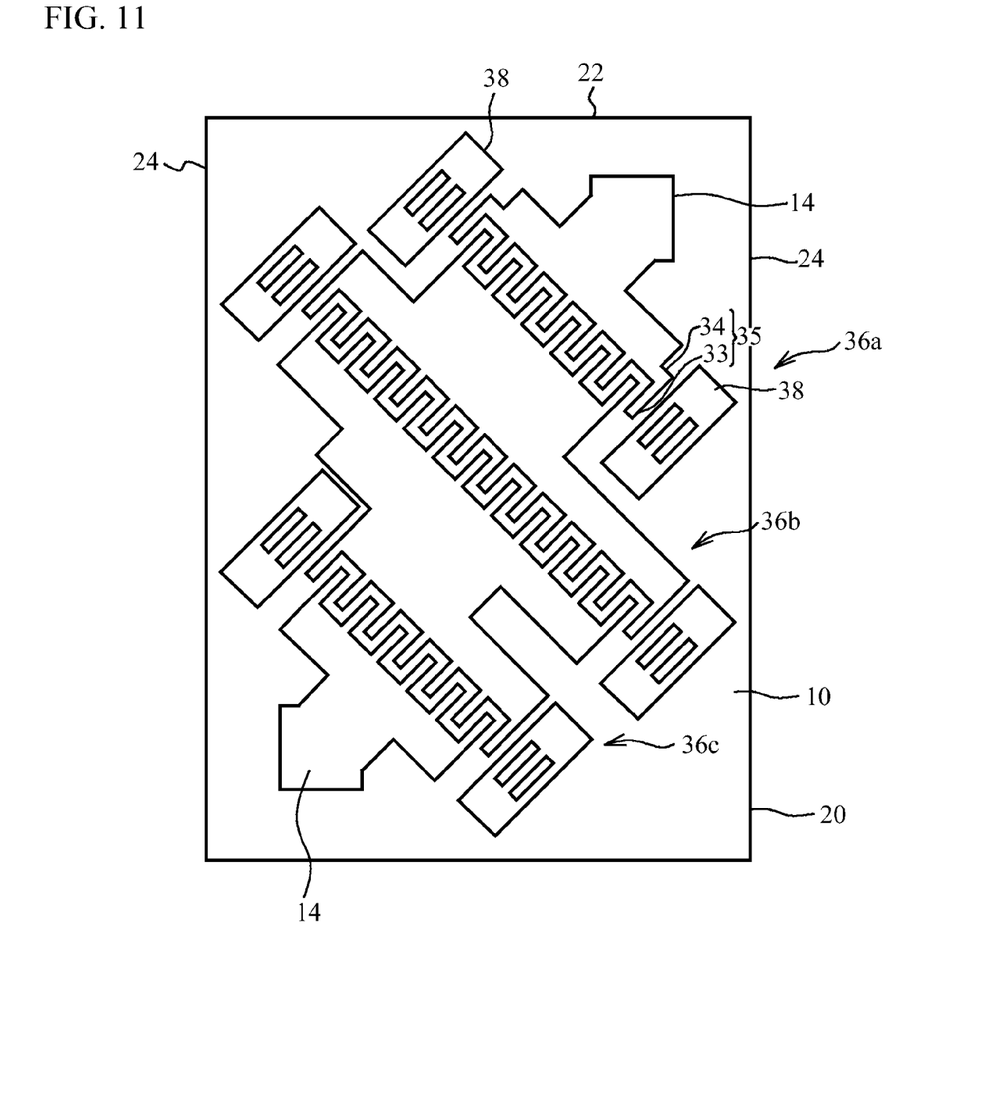
FIG. 11 is a plan view of an acoustic wave device chip in accordance with a fourth variation of the first embodiment.

FIG. 10A and FIG. 10B are plan view of a part of the acoustic wave device chip in accordance with the comparative example. FIG. 11 is a plan view illustrating an acoustic wave device chip in accordance with a fourth variation of the first embodiment. As illustrated in FIG. 10A, the input or output pad 14 is formed on the upper surface of the piezoelectric substrate 10. The input or output pad 14 is coupled to an IDT 36. The IDT 36 corresponds to the electrode 12. The propagation direction of the acoustic wave in the IDT 36 is parallel to the scribe line 22 of the acoustic wave device chip 20. Reflectors 38 are located at both sides of the IDT 36 in the propagation direction of the acoustic wave. The IDT 36 includes a pair of comb-shaped electrodes 35. The comb-shaped electrode 35 includes electrode fingers 33 and a bus bar 34 to which the electrode fingers 33 are coupled. The electrode fingers 33 of the pair of the comb-shaped electrodes 35 are alternately arranged.

In FIG. 10A, the input or output pad 14 is located at the scribe line 22 side of the IDT 36. In this case, a region 60 becomes a dead space in which the pad 14 and the electrode 12 are not formed. As illustrated in FIG. 10B, the dead space can be reduced by arranging the input or output pad 14 at the scribe line 24 side of the IDT 36. However, a trace pattern is laid from the bus bar 34 of the IDT 36 to an input or output pad 14a. Therefore, a resistance from the IDT 36 to the input or output pad 14a increases.

Assume that IDTs 36a through 36c are provided, and the propagation directions of the acoustic waves in the IDTs 36a through 36b are made to differ from the extending directions of the scribe lines 22 and 24 as illustrated in FIG. 11. The bus bar 34 located closest to the input or output pad 14 in the bus bars 34 is electrically coupled to the input or output pad 14. The bus bar 34 is electrically coupled to the electrode fingers 33, and forms the comb-shaped electrode 35. The comb-shaped electrode 35 is arranged in a direction approximately parallel to the X direction in order to excite the acoustic wave in the X direction as at minimum loss. Therefore, the IDT 36b longer than the shorter side can be arranged in accordance with requirements in designing.

The fourth variation of the embodiment configures four sides of the piezoelectric substrate included in the acoustic wave device chip 20 to be in approximate cleavage directions, and thus can provide the acoustic wave device capable of being easily cut, low loss, and downsized by using a space efficiently without increasing a resistance.

The first embodiment and its variations can be applied to acoustic wave devices using a piezoelectric substrate such as surface acoustic wave devices, boundary acoustic wave devices, and Love wave devices.

Although the embodiments of the present invention have been described in detail, it is to be understood that the various change, substitutions, and alterations could be made hereto without departing from the spirit and scope of the invention.

What is claimed is:

1. An acoustic wave device comprising:
   a piezoelectric substrate made of a piezoelectric crystal having cleavage directions that intersect with each other, the piezoelectric substrate being formed such that four sides of an upper surface of the piezoelectric substrate are parallel to said cleavage directions of the piezoelectric crystal; and
   a plurality of electrodes that are formed on the upper surface of the piezoelectric substrate and excites an acoustic wave propagating in a propagation direction different from the cleavage directions, each of the plurality of electrodes including electrode fingers and bus bars to which the electrode fingers are coupled,
   wherein an extending direction of each of the four sides is different from the propagation direction,
   wherein the plurality of electrodes are arranged in a direction inclined from the four sides of the upper surface of the piezoelectric substrate, and
   wherein a length of the bus bars of a central electrode among the plurality of electrodes is longer than a length of a shortest side among the four sides.

2. The acoustic wave device according to claim 1, further comprising:
   a support substrate to which the piezoelectric substrate is bonded.

3. The acoustic wave device according to claim 1, further comprising:
   an input or output pad formed on the upper surface of the piezoelectric substrate, wherein
   a bus bar, out of the bus bars, that is located closest to the input or output pad is electrically coupled to the input or output pad.

4. The acoustic wave device according to claim 1,
   wherein the piezoelectric substrate is a lithium tantalate substrate.

5. The acoustic wave device according to claim 4,
   wherein the propagation direction is an X direction.

6. The acoustic wave device according to claim 5, wherein an Y-cut direction of the lithium tantalate substrate is 42° so that an angle between each of the four sides and the propagation direction is 45°.

7. The acoustic wave device according to claim 5,
   wherein an Y-cut direction of the lithium tantalate substrate is greater than or equal to 39° and less than or equal to 48°.

8. A method of fabricating an acoustic wave device, the method comprising:
   preparing a piezoelectric substrate made of a piezoelectric crystal having cleavage directions that intersect with each other;
   forming a plurality of electrodes for exciting an acoustic wave on an upper surface of the piezoelectric substrate such that a propagation direction of the acoustic wave excited by the electrode differs from said cleavage directions, each of the plurality of electrodes including electrode fingers and bus bars to which the electrode fingers are coupled;
   forming grooves or modified regions that extend in said cleavage directions in the piezoelectric substrate; and
   breaking the piezoelectric substrate along the grooves or the modified regions,
   wherein the plurality of electrodes are arranged in a direction inclined from the four sides of the upper surface of the piezoelectric substrate, and
   wherein a length of the bus bars of a central electrode among the plurality of electrodes is longer than a length of a shortest side among the four sides.

9. The method according to claim 8, wherein
   the forming of the grooves or the modified regions includes irradiating the piezoelectric substrate with a laser beam.

10. The method according to claim 8, wherein
    wherein the piezoelectric substrate is a lithium tantalate substrate,
    wherein the propagation direction is an X direction, and
    wherein an Y-cut direction of the lithium tantalate substrate is 42° so that an angle between each of the four sides and the propagation direction is 45°.

* * * * *